United States Patent
Chang et al.

(10) Patent No.: US 7,983,092 B2
(45) Date of Patent: Jul. 19, 2011

(54) NONVOLATILE MEMORY APPARATUS AND METHOD OF USING THIN FILM TRANSISTOR AS NONVOLATILE MEMORY

(75) Inventors: Ting-Chang Chang, Taipei Hsien (TW); Fu-Yen Jian, Taipei Hsien (TW); Te-Chih Chen, Taipei Hsien (TW)

(73) Assignee: Acer Incorporated, Hsichih (TW)

( * ) Notice: Subject to any disclaimer, the term of this patent is extended or adjusted under 35 U.S.C. 154(b) by 106 days.

(21) Appl. No.: 12/465,153

(22) Filed: May 13, 2009

(65) Prior Publication Data

US 2010/0254185 A1     Oct. 7, 2010

(30) Foreign Application Priority Data

Apr. 3, 2009  (TW) .............................. 98111112 A

(51) Int. Cl.
    *G11C 16/04* (2006.01)
(52) U.S. Cl. ......... 365/185.26; 365/185.28; 365/185.29; 365/184; 257/315

(58) Field of Classification Search ............. 365/185.26, 365/185.28, 185.29, 174, 189.011, 184; 257/315, 257/347

See application file for complete search history.

(56) References Cited

U.S. PATENT DOCUMENTS

| 5,737,261 | A | * | 4/1998 | Taira ............................. 365/145 |
| 6,005,270 | A | | 12/1999 | Noguchi |
| 7,573,090 | B2 | * | 8/2009 | Takano et al. ................. 257/315 |
| 7,714,408 | B2 | * | 5/2010 | Tokunaga ..................... 257/530 |
| 2004/0206957 | A1 | | 10/2004 | Inoue et al. |
| 2008/0128809 | A1 | * | 6/2008 | Ohnuma ....................... 257/347 |

\* cited by examiner

*Primary Examiner* — Tuan T Nguyen
*Assistant Examiner* — Toan Le
(74) *Attorney, Agent, or Firm* — C. G. Mersereau; Nikolai & Mersereau, P.A.

(57) ABSTRACT

The present invention relates to a nonvolatile memory apparatus and a method of using a thin film transistor (TFT) as a nonvolatile memory by storing carriers in a body of the TFT, which operates a general TFT as a memory cell of a nonvolatile memory by manipulating the electrical characteristics of the TFT in order to integrate with other electrical components formed by TFTs, such as logic circuit or TFT-LCD pixel transistor, on the LCD panel without additional semiconductor manufacturing processes.

15 Claims, 7 Drawing Sheets

NONVOLATILE MEMORY APPARATUS AND METHOD OF USING THIN FILM TRANSISTOR AS NONVOLATILE MEMORY

FIELD OF THE INVENTION

The present invention relates to a nonvolatile memory apparatus and a method of using a thin film transistor (TFT) as a nonvolatile memory by storing carriers (including electrons and holes) in a body of the TFT, which operates a general TFT as a memory cell of a nonvolatile memory by manipulating the electrical characteristics of the TFT.

BACKGROUND OF THE INVENTION

As a result of the flat panel display widely used in the electrical devices, such as computers, televisions and communication devices, in recent years, the requirements of the flat panel display with high performance have raised. To achieve the purpose of system on panel, the peripheral circuits of the flat panel display have been integrated on the Low Temperature PolySilicon (LTPS) TFT-LCD panel, and using TFTs as the nonvolatile memory is very critical to such purpose.

Currently, most of techniques about integrating the nonvolatile memory on the panel change the structure of a general TFT in order to storage carriers (including electrons and holes). Please refer to U.S. Pub. No. 2004/0206957 "SEMICONDUCTOR DEVICE AND METHOD OF MAINUFACTURE" and U.S. Pat. No. 6,005,270 "SEMICONDUCTOR NONVOLATILE MEMORY DEVICE AND METHOD OF PRODUCTION OF SAME" for related arts regarding using TFT as nonvolatile memory. U.S. Pub. No. 2004/0206957 discloses a plurality of silicon particles for trapping the charge of injected carriers are placed between two gate oxide films; U.S. Pat. No. 6,005,270 discloses a charge storing layer formed between the gate and the gate oxide film.

However, manufacturing processes of the methods for adding the mentioned floating gate or tunneling oxide are more complicated than the general process of TFTs, thus increasing the cost. Moreover, when the electrical components become further miniaturized, the tunneling oxide is formed thinner and prohibits the data retention of the memory. Therefore, there are problems to be solved in the conventional methods for using general thin film transistors as nonvolatile memory.

SUMMARY OF THE INVENTION

An objective of the present invention is to provide a method for using a thin film transistor (TFT) as a nonvolatile memory by storing carriers in a body of the TFT, which operates by manipulating the electrical characteristics of the TFT. When the TFT is turned on to cause the self-heating effect and generate electron-hole pairs, the vertical electric field on the gate separates the electron-hole pairs and injects the carriers to the body of the TFT in order to make the carriers store in the body and complete the writing operation. The method can be used for nonvolatile memory and takes advantage of integrating with other electrical components formed by TFTs, such as logic circuit or TFT-LCD pixel transistor, on the LCD panel without additional semiconductor manufacturing processes.

Another objective of the present invention is to provide a nonvolatile memory apparatus by using thin film transistors as memory units, which integrates with other TFT components on a same substrate without additional semiconductor manufacturing processes.

In order to achieve the foregoing objectives of the invention, a method of storing carriers in a body of a thin film transistor according to the present invention is provided, which comprises a thin film transistor including a semiconductor layer formed over a substrate having a insulating surface, a gate insulating film formed over the semiconductor layer and a gate formed over the gate insulating film, wherein the semiconductor layer includes a body formed between a source and a drain, the method includes providing a first drain voltage to the drain, a gate voltage to the gate and grounding the source at the same time, wherein when a Joule Heat resulted by the gate voltage and the first drain voltage is enough to cause the self-heating effect, majority carriers (holes with N-channel) of the thin film transistor are induced to be stored in the body of the thin film transistor, and the threshold voltage of the thin film transistor is changed to complete the writing operation; providing a second drain voltage to the drain, a source voltage to the source and grounding the gate at the same time, wherein when a potential difference between the second drain voltage and the source voltage is enough to make the majority carriers stored in the body overcome the energy barrier in grain boundary of the body, the bias of the drain, and the source removes the majority carriers from the body of the semiconductor layer of the thin film transistor to complete the erasing operation.

A further embodiment of the present invention is to provide a nonvolatile memory apparatus by using the TFTs as memory units providing a writing operation and an erasing operation, which comprises a memory for data access, including a plurality of memory units arranged in a matrix form, each of said memory units including a semiconductor layer formed over a substrate having a insulating surface, a gate insulating film formed over the semiconductor layer and a gate formed over the gate insulating film; a logic circuit for data control, wherein the semiconductor layer of the memory units includes a body formed between a source and a drain, and the memory units are general TFTs integrated with the logic circuit on the substrate.

DETAILED DESCRIPTION OF THE INVENTION

The techniques employed by the present invention to achieve the foregoing objectives and the effects thereof are described hereinafter by way of examples with reference to the accompanying drawings.

Figure 1:
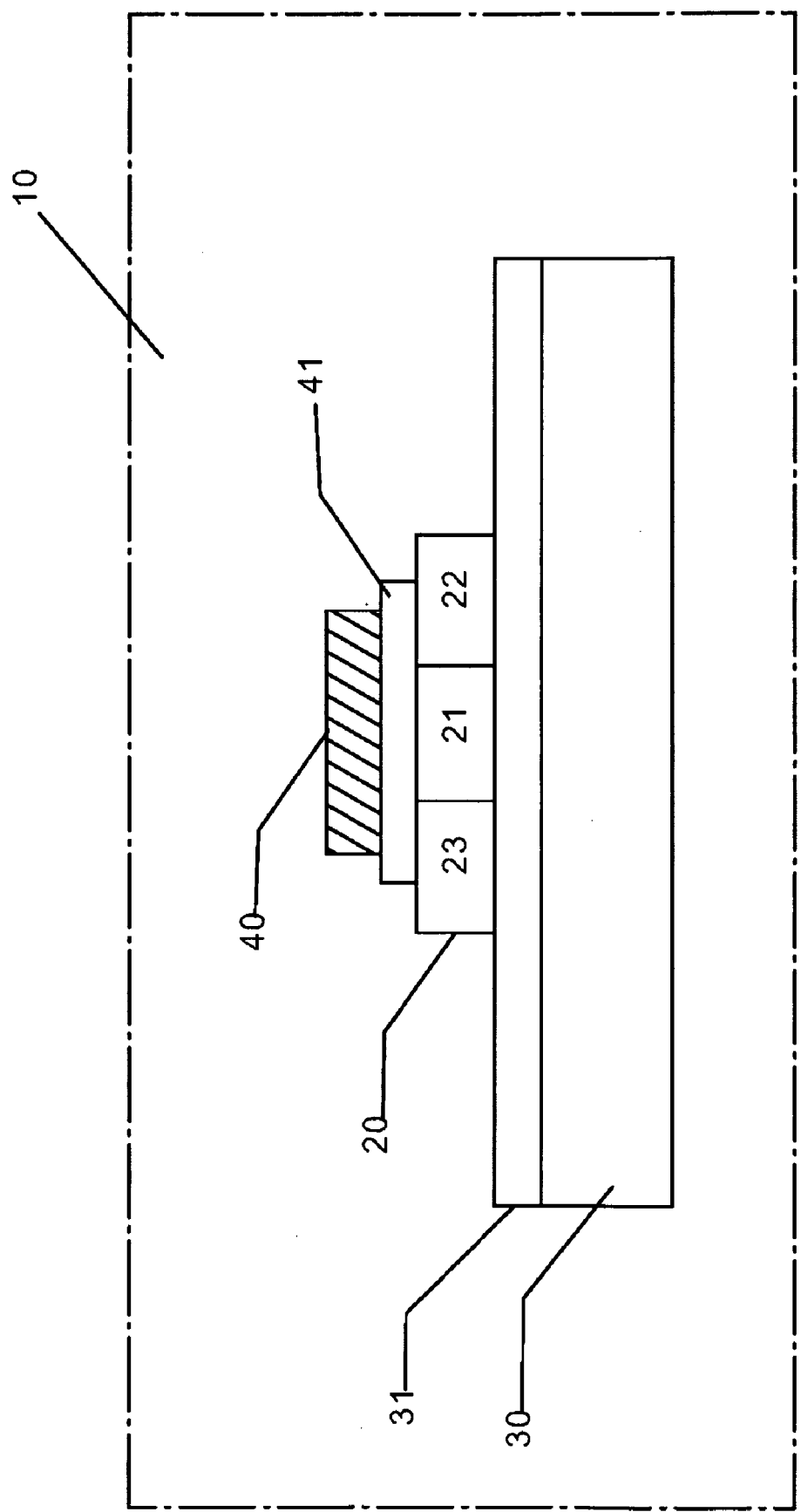
FIG. 1 is a sectional view showing a TFT memory according to the first embodiment of the invention.

FIG. 1 is a sectional view showing a TFT memory according to the first embodiment of the invention. Referring to FIG.

1 the present invention uses a thin film transistor (10) comprising a semiconductor layer (20) which includes a body (21) formed between a drain (22) and a source (23) and is formed over a substrate (30) having a insulating surface (31), a gate insulating film (41) formed over the semiconductor layer (20) and a gate (40) formed over the gate insulating film (41). A method for storing carriers in a body of a thin film transistor according to the invention comprises a writing operation and an erasing operation.

Figure 2:
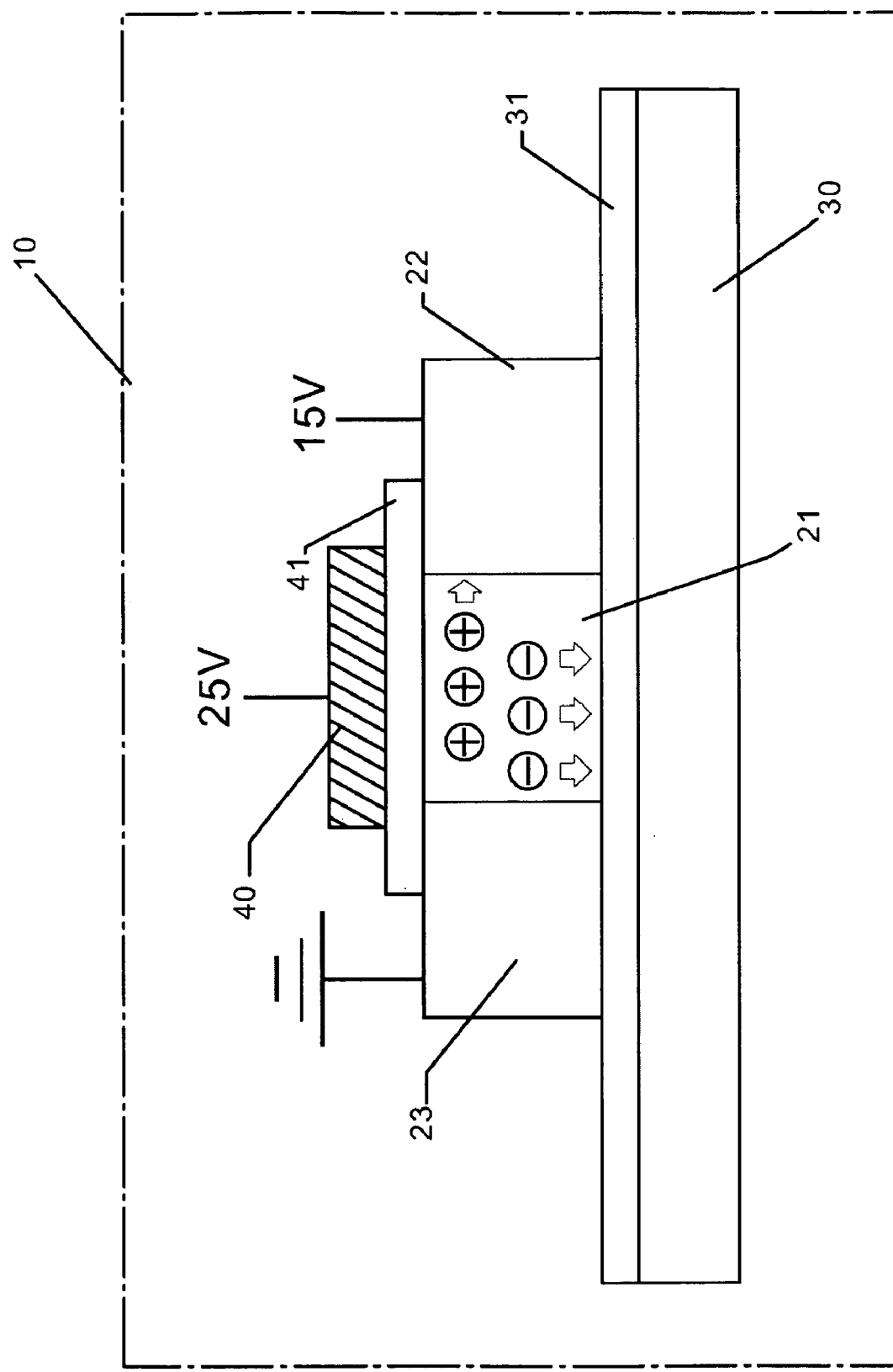
FIG. 2 is a diagram showing voltages in the writing operation according to the first embodiment of the invention.

FIG. 2 is a diagram showing voltages in the writing operation according to the first embodiment of the invention. The writing operation provides a first drain voltage, 15V in this embodiment, to the drain (22) of the thin film transistor (10), a gate voltage, 25V in this embodiment, to the gate (40) and grounds the source (23) of the thin film transistor (19) at the same time, wherein when a Joule Heat (the product of drain current and drain voltage) resulted by the gate voltage and the first drain voltage is enough to cause the self-heating effect, under the electric field effects of the gate (40), the electrons are emitted from the valence band to the conduction band of the semiconductor layer (20). The electron-hole pairs are generated and separated by the vertical electric filed on the gate (40), and the majority carriers (holes with N-channel) stores in the body (20) of the thin film transistor (10). The threshold voltage of the thin film transistor (10) is changed to complete the writing operation. According to the data in this embodiment with N-channel, the time of writing operation takes 3 milliseconds and the memory window is 3V.

Figure 3:
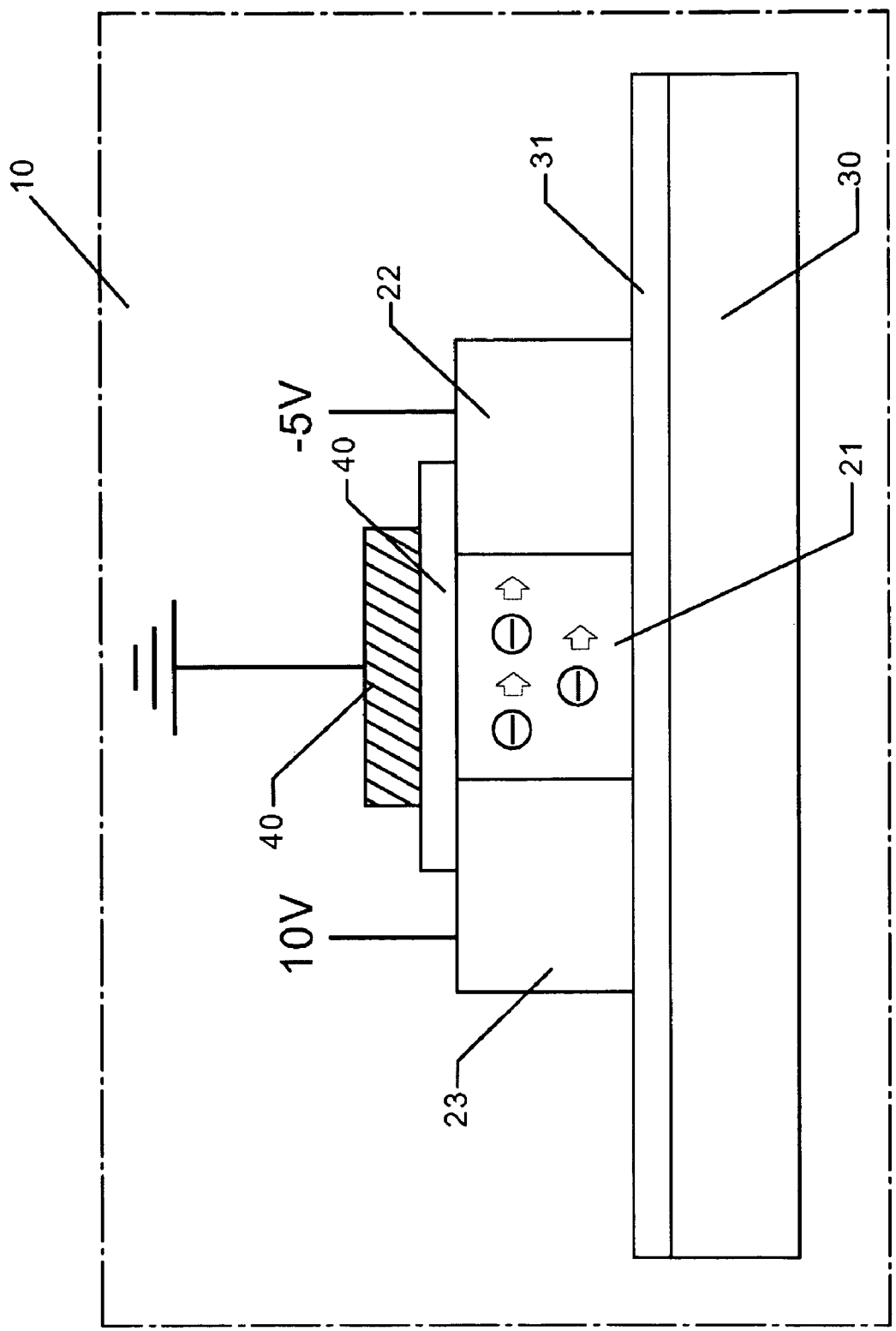
FIG. 3 is a diagram showing voltages in the erasing operation according to the first embodiment of the invention.

FIG. 3 is a diagram showing voltages in the erasing operation according to the first embodiment of the invention. The erasing operation provides a second drain voltage, −5V in this embodiment, to the drain (22) of the thin film transistor (10), a source voltage, 10V in this embodiment, to the source (23) and grounds the gate (40) at the same time, wherein when a potential difference between the second drain voltage and the source voltage is enough to make the majority carriers stored in the body (21) overcome the energy barrier in grain boundary of the body (21), the bias of the drain, and the source removes the majority carriers from the body (21) of the semiconductor layer (20) of the thin film transistor (10) to complete the erasing operation. According to the data in this embodiment with N-channel, the time of erasing operation takes 100 milliseconds.

Figure 4:
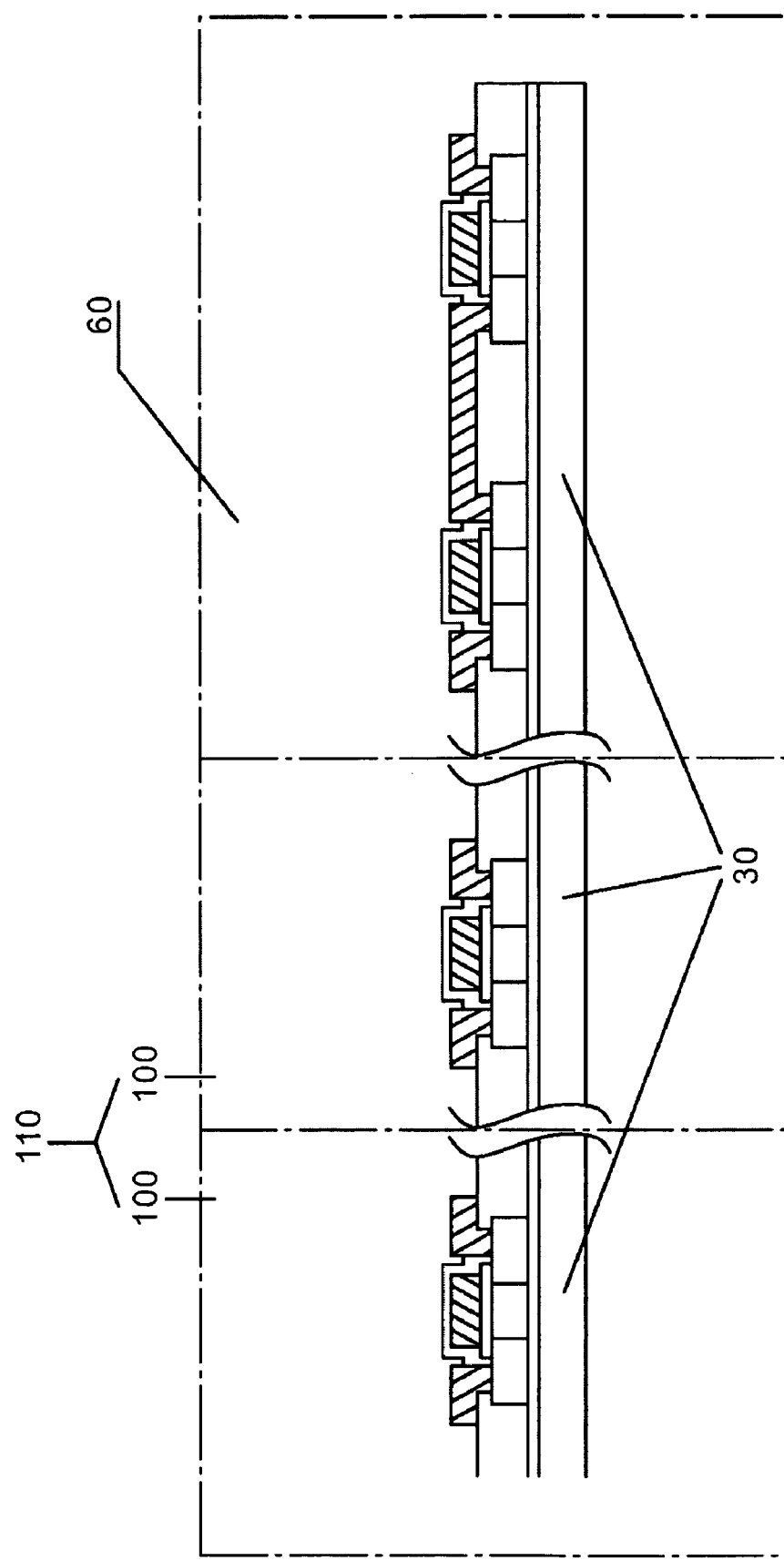
FIG. 4 is a sectional view showing a nonvolatile memory apparatus according to the second embodiment of the present invention.
Figure 5:
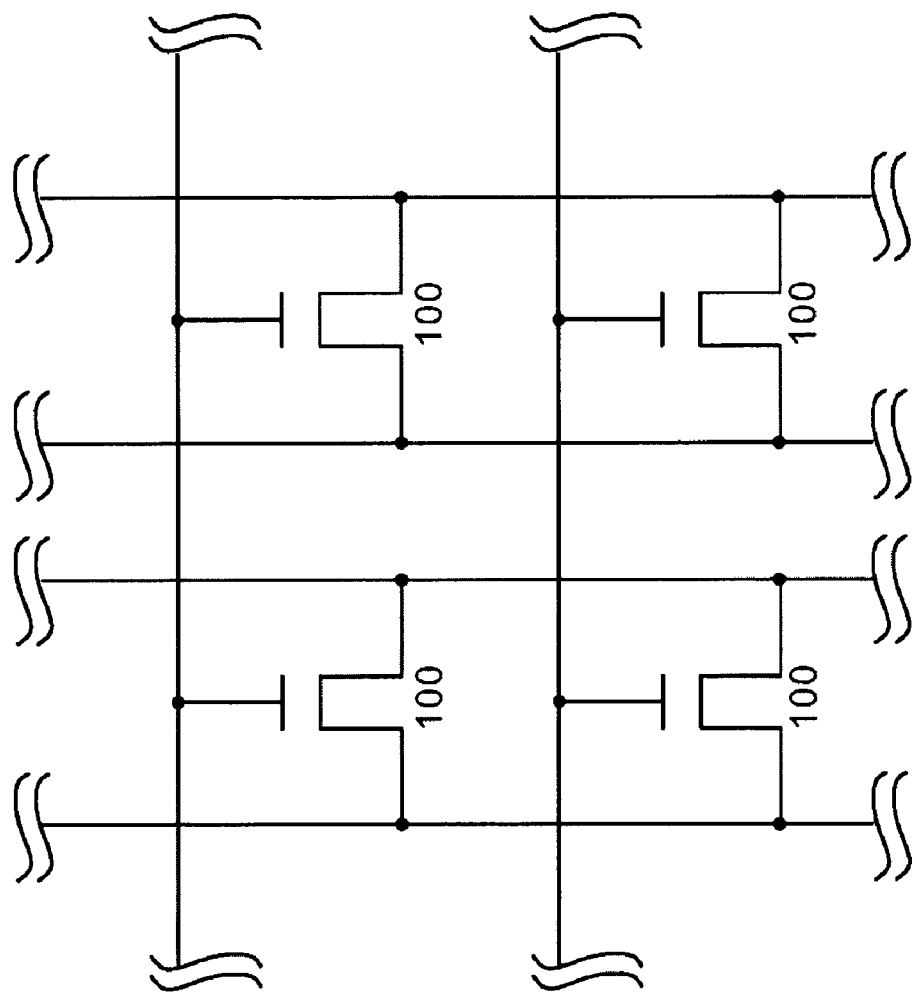
FIG. 5 is a diagram showing memory units in a matrix form according to the second embodiment of the present invention.

FIG. 4 is a sectional view showing a nonvolatile memory apparatus according to the second embodiment of the present invention, and FIG. 5 is a diagram showing memory units in a matrix form according to the second embodiment of the present invention. Referring to FIG. 4, the present invention uses thin film transistors as memory units of a nonvolatile memory apparatus comprising a memory (110) for data access and a logic circuit (60) for data control, wherein the logic circuit (60) comprise at least one thin film transistor (TFT) and is integrated with the memory (110) on a substrate (30). Referring to FIG. 5, the memory (110) includes a plurality of memory units (100) arranged in a matrix form providing a writing operation and an erasing operation.

Figure 6:
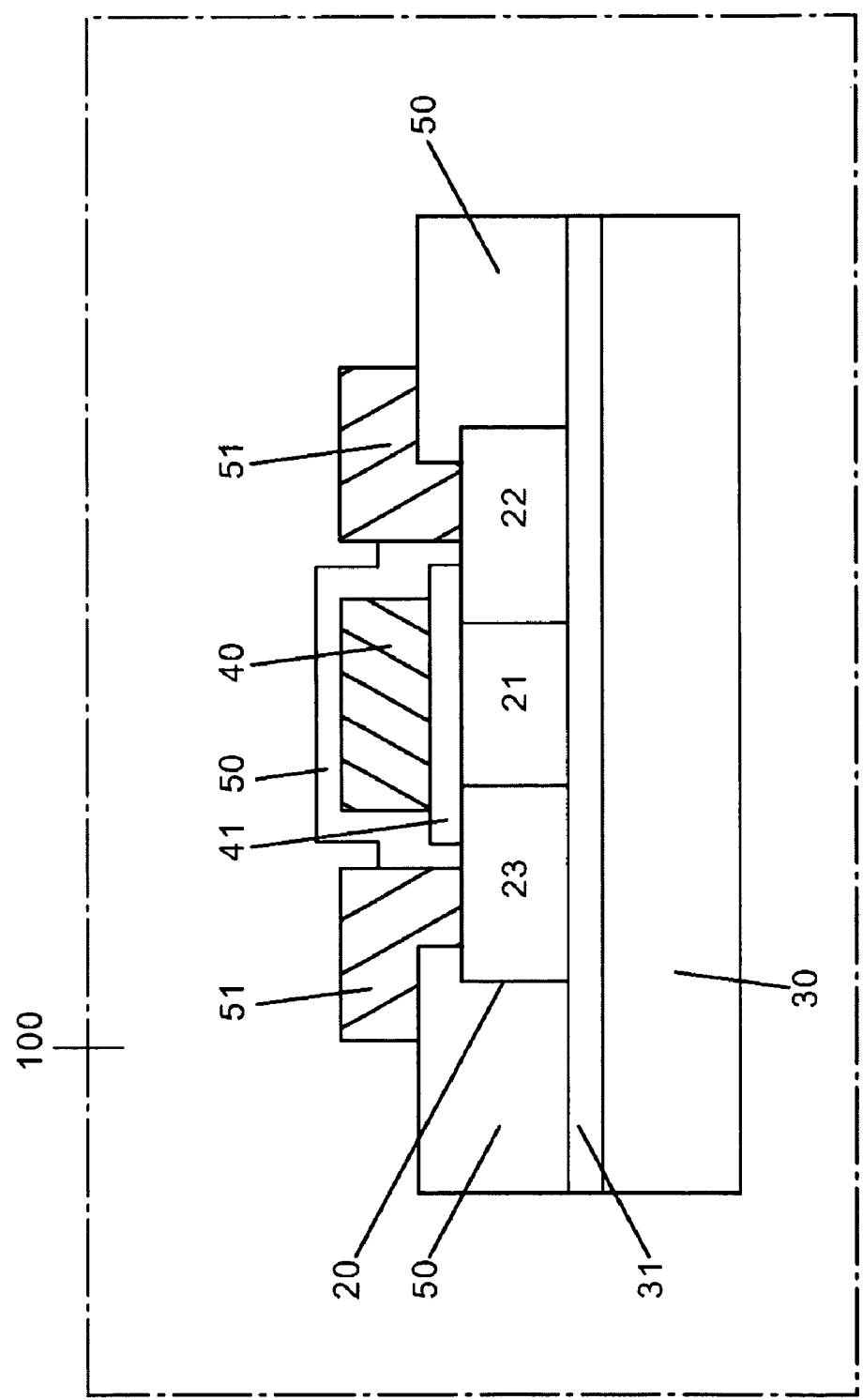
FIG. 6 is a sectional view showing one of memory units according to the second embodiment of the present invention.

FIG. 6 is a sectional view showing one of memory units according to the second embodiment of the present invention. Referring to FIG. 6, each of the memory units (100) includes a semiconductor layer (20) formed over a substrate (30) having a insulating surface (31), a gate insulating film (41) formed over the semiconductor layer (20) and a gate (40) formed over the gate insulating film (41), wherein the semiconductor layer (20) of the memory units (100) includes a body formed between a source (23) and a drain (22), and the memory units (100) are general TFTs covered by a interlayer insulating film (50) and connected to peripheral circuits by the metal layer (51).

During the writing operation, the drain (22) is provided a first drain voltage, the gate (40) is provided a gate voltage and the source (23) is grounded, wherein when a Joule Heat (the product of drain current and drain voltage) resulted by the gate voltage and the first drain voltage is enough to cause the self-heating effect, under the electric field effects of the gate (40), the electrons are emitted from the valence band to the conduction band of the semiconductor layer (20). The electron-hole pairs are generated and separated by the vertical electric filed on the gate (40), and the majority carriers (holes with N-channel) stores in the body (20) of the memory units (100). The threshold voltage of the thin film transistor (10) is changed to complete the writing operation.

During the erasing operation, the drain (22) is provided a second drain voltage, the source (23) is provided a source voltage, and the gate (40) is grounded at the same time, wherein when a potential difference between the second drain voltage and the source voltage is enough to make the majority carriers stored in the body (21) overcome the energy barrier in grain boundary of the body (21), the bias of the drain, and the source removes the majority carriers from the body (21) of the semiconductor layer (20) of memory units (100) to complete the erasing operation.

Figure 7:
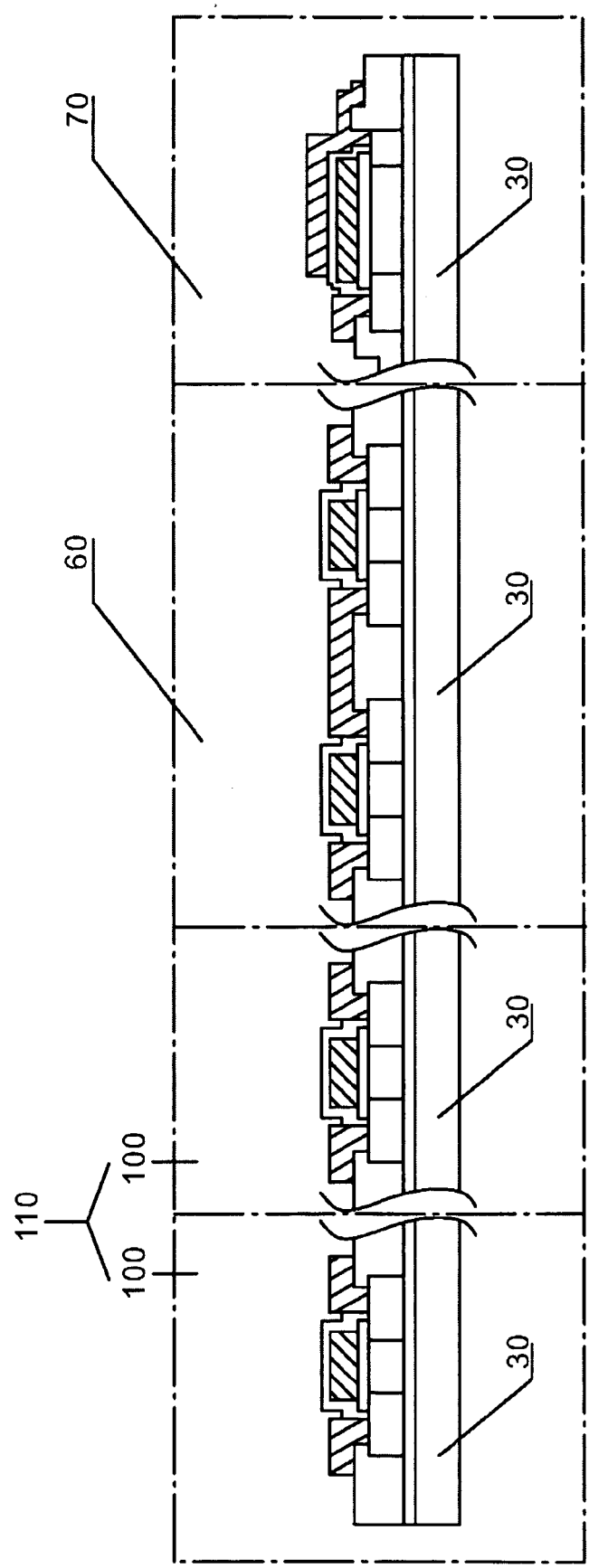
FIG. 7 is a sectional view showing integration of a nonvolatile memory device according to the second embodiment of the present invention.

Referring to FIG. 7, a sectional view showing integration of a nonvolatile memory device according to the second embodiment of the present invention, the nonvolatile memory device according to the present invention can further be integrated with general TFT-LCD's pixel units (70) on the substrate (30), a Low Temperature PolySilicon (LTPS) substrate.

Hence the nonvolatile memory apparatus and the method of using a thin film transistor (TFT) as a nonvolatile memory by storing carriers in a body of the TFT according to the present invention, which makes the nonvolatile memory integrated with the TFT-LCD on a panel by using general TFTs storing carriers without additional floating gate or tunneling oxide, would decrease steps in the semiconductor manufacturing process of memory and reduce the manufacturing cost.

The preferred embodiments of the present invention have been disclosed in the examples. However the examples should not be construed as a limitation on the actual applicable scope of the invention, and as such, all modifications and alterations without departing from the spirits of the invention and appended claims shall remain within the protected scope and claims of the invention.

What is claimed is:

1. A method of storing carriers in a body of a thin film transistor, wherein the thin film transistor includes a semiconductor layer formed over a substrate having a insulating surface, a gate insulating film formed over the semiconductor layer and a gate formed over the gate insulating film, wherein the semiconductor layer includes a body formed between a source and a drain, the method comprising the steps of:

(a) providing a first drain voltage to the drain, a gate voltage to the gate and grounding the source at the same time, wherein when a Joule Heat resulted by the gate voltage and the first drain voltage is enough to cause the self-heating effect, majority carriers of the thin film transistor are induced to be stored in the body of the thin film transistor, and the threshold voltage of the thin film transistor is changed to complete a writing operation; and (b) providing a second drain voltage to the drain, a source voltage to the source and grounding the gate at the same time, wherein when a potential difference between the second drain voltage and the source voltage is enough to make the majority carriers stored in the body overcome the energy barrier in grain boundary of the body, the bias of the drain, and the source removes the majority carriers from the body of the semiconductor layer of the thin film transistor to complete an erasing operation.

2. A method of storing carriers in a body of a thin film transistor according to claim 1, wherein the gate voltage and the first drain voltage are positive.

3. A method of storing carriers in a body of a thin film transistor according to claim 1, wherein the thin film transistor is integrated with other electrical components formed by general TFTs on the said substrate.

4. An erasing method applied to a nonvolatile memory apparatus providing a writing operation and an erasing operation, wherein the nonvolatile memory apparatus comprises:
   a memory for data access, including a plurality of memory units arranged in a matrix form, each of said memory units including a semiconductor layer formed over a substrate having an insulating surface, a gate insulating film formed over the semiconductor layer and a gate formed over the gate insulating film; and
   a logic circuit for data control, wherein the semiconductor layer of the memory units includes a body formed between a source and a drain, and the memory units are general TFTs integrated with the logic circuit on the said substrate;
   wherein the erasing method comprises providing a drain voltage to the drain, a source voltage to the source and grounding the gate at the same time, wherein when a potential difference between the drain voltage and the source voltage is enough to make the majority carriers stored in the body overcome the energy barrier in grain boundary of the body, the bias of the drain, and the source removes the majority carriers from the body of the semiconductor layer of the thin film transistor to complete the erasing operation.

5. An erasing method applied to a nonvolatile memory apparatus according to claim 4, wherein when a Joule Heat resulted by a gate voltage and a first drain voltage is enough to cause the self-heating effect, majority carriers of the memory units are induced to be stored in the body of the thin film transistor, and the threshold voltage of the memory units is changed to complete the writing operation.

6. An erasing method applied to a nonvolatile memory apparatus according to claim 5, wherein the gate voltage and the first drain voltage are positive.

7. An erasing method applied to a nonvolatile memory apparatus according to claim 4, wherein the logic circuit comprising at least one thin film transistor and integrated with the memory on the substrate.

8. An erasing method applied to a nonvolatile memory apparatus according to claim 7, wherein the substrate is a Low Temperature PolySilicon (LTPS) substrate.

9. An erasing method applied to a nonvolatile memory apparatus according to claim 8, wherein the nonvolatile memory is integrated with general TFT-LCD panels in a same manufacturing process on the LTPS substrate.

10. A writing method applied to a nonvolatile memory apparatus, wherein the nonvolatile memory apparatus comprising a memory for data access, including a plurality of memory units arranged in a matrix form, each of said memory units including a semiconductor layer formed over a substrate having a insulating surface, a gate insulating film formed over the semiconductor layer and a gate formed over the gate insulating film; and a logic circuit for data control, wherein the semiconductor layer of the memory units includes a body formed between a source and a drain, and the memory units are general TFTs integrated with the logic circuit on the said substrate; the erasing method comprising:
    providing a first drain voltage to the drain, a gate voltage to the gate and grounding the source at the same time, wherein when a Joule Heat resulted by the gate voltage and the first drain voltage is enough to cause the self-heating effect, majority carriers of the thin film transistor are induced to be stored in the body of the thin film transistor, and the threshold voltage of the thin film transistor is changed to complete the writing operation.

11. A writing method applied to a nonvolatile memory apparatus according to claim 10, wherein the gate voltage and the first drain voltage are positive.

12. A writing method applied to a nonvolatile memory apparatus according to claim 10, wherein when a potential difference between a second drain voltage and a source voltage is enough to make the majority carriers stored in the body overcome the energy barrier in grain boundary of the body, the bias of the drain and the source removes the majority carriers from the body of the semiconductor layer of the memory units to complete the erasing operation.

13. A writing method applied to a nonvolatile memory apparatus according to claim 10, wherein the logic circuit comprising at least one thin film transistor and integrated with the memory on the substrate.

14. A writing method applied to a nonvolatile memory apparatus according to claim 13, wherein the substrate is a Low Temperature PolySilicon (LTPS) substrate.

15. A writing method applied to a nonvolatile memory apparatus according to claim 14, wherein the nonvolatile memory is integrated with general TFT-LCD panels in a same manufacturing process on the LTPS substrate.

* * * * *